(12) United States Patent
Lee et al.

(10) Patent No.: US 7,741,133 B2
(45) Date of Patent: Jun. 22, 2010

(54) RESISTANCE MEASUREMENTS OF A HELICAL COIL

(75) Inventors: Edward Hin Pong Lee, San Jose, CA (US); Jennifer Ai-Ming Leung, Fremont, CA (US)

(73) Assignee: Hitachi Global Storage Technologies Netherlands, B.V., Amsterdam (NL)

(*) Notice: Subject to any disclaimer, the term of this patent is extended or adjusted under 35 U.S.C. 154(b) by 105 days.

(21) Appl. No.: 11/957,484

(22) Filed: Dec. 17, 2007

(65) Prior Publication Data
US 2009/0153157 A1 Jun. 18, 2009

(51) Int. Cl.
*H01L 21/00* (2006.01)
*H01F 30/12* (2006.01)
*G01R 1/00* (2006.01)

(52) U.S. Cl. ............... 438/17; 324/76.75; 324/112
(58) Field of Classification Search .......... 438/14, 438/17; 324/76.76, 112
See application file for complete search history.

(56) References Cited

U.S. PATENT DOCUMENTS

| | | | |
|---|---|---|---|
| 5,956,566 A * | 9/1999 | Lin et al. .............. 438/17 |
| 6,240,622 B1 * | 6/2001 | Ahn et al. .............. 29/604 |
| 6,493,191 B1 | 12/2002 | Cain et al. |
| 6,534,974 B1 | 3/2003 | Bowen et al. |
| 6,646,448 B2 | 11/2003 | Ko et al. |
| 6,712,985 B2 * | 3/2004 | Biskeborn .............. 216/22 |
| 7,289,302 B1 * | 10/2007 | Mallary .............. 360/323 |
| 7,372,282 B2 * | 5/2008 | Hachisuka et al. ...... 324/691 |
| 2009/0128941 A1 * | 5/2009 | Taratorin .............. 360/31 |

* cited by examiner

*Primary Examiner*—W. David Coleman
(74) *Attorney, Agent, or Firm*—Duft Bornsen & Fishman, LLP

(57) ABSTRACT

Test methods and components are disclosed for testing resistances of helical coils formed in magnetic recording heads. Helical coils in magnetic recording heads include a bottom coil structure, a top coil structure, and connecting structures that electrically connect the top and bottom coil structures. A test component is fabricated on the wafer along with the magnetic recording heads. The test component includes a bottom coil structure connected in series, and includes a top coil structure connected in series which is electrically disconnected from the bottom coil structure. Resistances of the top and bottom coil structures are measured in the test component. A total resistance of a helical coil is also measured. The resistance of the connecting structures in the helical coil may then be determined based on the resistance of the bottom coil structure, the resistance of the top coil structure, and the total resistance of the helical coil.

11 Claims, 11 Drawing Sheets

RESISTANCE MEASUREMENTS OF A HELICAL COIL

BACKGROUND OF THE INVENTION

1. Field of the Invention

The invention is related to the field of wafer fabrication and, in particular, to measuring the resistance of a helical coil.

2. Statement of the Problem

Wafer fabrication is a procedure composed of many repeated sequential processes to produce electrical circuits, devices, components, etc. For example, wafer fabrication is typically used to build semiconductor components, such as amplifiers or transistors. Wafer fabrication is also used to build magnetic recording or magnetic memory devices, such as magnetoresistance (MR) read elements, write elements, etc. The electrical circuits, devices, components, etc, that are formed on a wafer are referred to herein as functional components.

One type of functional component formed through wafer fabrication is magnetic recording heads. Magnetic recording heads (sometimes referred to as sliders) are used to write to magnetic recording disks and to read from magnetic recording disks, such as in a hard disk drive. The magnetic recording heads include write elements that are adapted to write bits to the magnetic recording disk. Write elements typically have the structure of a write pole, a return pole, and a yoke. A coil is wrapped around the yoke, and when current is applied through the coil, a magnetic flux is induced in the yoke which is used to write to the magnetic disk.

There are two types of coils that are typically used in a write element. One type of coil is a spiral coil. A spiral coil is flat on a single plane. The spiral coil begins at an inner radius and loops outwardly to larger radii. Each loop of the spiral coil is referred to as a turn. Another type of coil is a helical coil. A helical coil has a three-dimensional structure where the loops wrap as if around the surface of a cylinder (even though the loops may not have a perfect circular shape).

In wafer fabrication, a spiral coil may be formed through photolithographic processes by defining a photoresist on a conductive layer in the desired shape of the spiral coil. A plating process is then performed to deposit conductive metal in the photoresist opening area. The photoresist is then removed, which defines the spiral coil.

Because a helical coil is not on a single plane like the spiral coil, the helical coil is formed in multiple photolithographic steps. First, a bottom coil structure is formed from conductive material. The bottom coil structure is comprised of a plurality of traces that are disconnected from one another and aligned longitudinally on a first plane. Then multiple other steps are performed to fabricate other parts of the write element, such as the yoke of the write element. In these fabrication steps, connecting structures are built up from the bottom coil structure with conductive material. The connecting structures are used to eventually connect the bottom coil structure to a top coil structure. The top coil structure is then formed from conductive material. The top coil structure is also comprised of a plurality of traces that are disconnected from one another and aligned longitudinally on a second plane. The top coil structure connects to the connecting structure in a manner to define the helical shape for the coil. An example of fabricating a helical coil is illustrated in FIGS. 1-7.

Recording head fabricators typically measure the resistance of the coils in the write elements to determine the quality of the fabrication processes used to form the coils, and to achieve a desired resistance specification. One problem with measuring the resistance of a helical coil is that there are multiple components that contribute to the resistance of the helical coil. The bottom coil structure, the connecting structures, and the top coil structure each contribute to the total resistance of the helical coil. The resistance of the connecting structures may be of particular interest. The connecting structures are built up from multiple layers of conductive material as other elements of the write element are formed. In other words, the connecting structures are built up with whatever conductive material is being used to form other layers, whether it be Cu, Au, etc. Thus, there may be a higher chance of error in forming the connecting structures than in forming the bottom coil structure and the top coil structure.

Presently, if the resistance of the helical coil is measured and is found to be higher than desired, recording head fabricators are not able to determine which of the structures are causing the high resistance. Thus, recording head fabricators are unable to adequately determine which of the fabrication processes to modify to fix the problem.

SUMMARY OF THE SOLUTION

Embodiments of the invention solve the above and other related problems with test components that are fabricated on a wafer along with the magnetic recording heads. The test components are fabricated with a bottom coil structure and a top coil structure that are electrically disconnected from one another. The traces of the bottom coil structure are connected to one another in series so that the overall resistance of the traces may be measured. Similarly, the traces of the top coil structure are connected to one another in series so that the overall resistance of the traces may be measured. With the resistance of the bottom coil structure and the resistance of the top coil structure measured, the total resistance of a helical coil is measured (either on a magnetic recording head or a test component). The resistance of the connecting structures of the helical coil may then be determined by subtracting the resistance of the bottom coil structure and the resistance of the top coil structure from the total resistance of the helical coil. The resistance of each contributing component of the helical coil may advantageously be measured. Recording head fabricators are thus able to modify fabrication processes accordingly if problems are encountered.

One embodiment of the invention comprises a method of testing resistances of helical coils formed in magnetic recording heads on a wafer. The helical coils in the magnetic recording heads include a bottom coil structure, a top coil structure, and a plurality of connecting structures that electrically connect the bottom coil structure and the top coil structure to define a helical coil. According to the method, a test component is fabricated on the wafer along with the magnetic recording heads. The test component includes a bottom coil structure connected in series, and also includes a top coil structure connected in series. The bottom coil structure and the top coil structure are electrically disconnected from each other. A resistance of the bottom coil structure is measured in the test component, and a resistance of the top coil structure is measured in the test component. A total resistance of a helical coil that is fabricated on the wafer is then measured. The resistance of the connecting structures in the helical coil may then be determined based on the resistance of the bottom coil structure, the resistance of the top coil structure, and the total resistance of the helical coil. Recording head fabricators are thus able to determine the individual resistances of the bottom coil structure, the top coil structure, and the connecting structures in order to identify problems in fabrication.

Another embodiment of the invention comprises a method of fabricating a test component on the wafer concurrently with the magnetic recording heads that include helical coils. For the method, a bottom coil structure is formed in the test component. The bottom coil structure is comprised of a plurality of bottom coil traces. Bottom connections are then formed between the bottom coil traces to connect the bottom coil traces in series. An insulation layer is then deposited in the test component to electrically isolate the bottom coil structure from a subsequently deposited top coil structure. A top coil structure is then formed in the test component on the insulation layer. The top coil structure is comprised of a plurality of top coil traces. Top connections are then formed between the top coil traces to connect the top coil traces in series. The resistance of the bottom coil structure and the resistance of the top coil structure may then be measured independently from one another.

Another embodiment of the invention comprises a method of fabricating a test component adapted to test for shorts in a coil structure. For the method, a test coil structure is formed, which is comprised of a plurality of traces that are aligned longitudinally on a plane. A first set of alternating traces are connected to a first test pad. A second set of alternating traces are connected to a second test pad. A resistance between the first test pad and the second test pad is then measured to determine if there is a short between two sequential traces in the coil structure caused by incomplete seed layer removal or poor photolithographic processes.

The invention may include other exemplary embodiments described below.

DESCRIPTION OF THE DRAWINGS

The same reference number represents the same element or same type of element on all drawings.

DETAILED DESCRIPTION OF THE INVENTION

Figure 1:
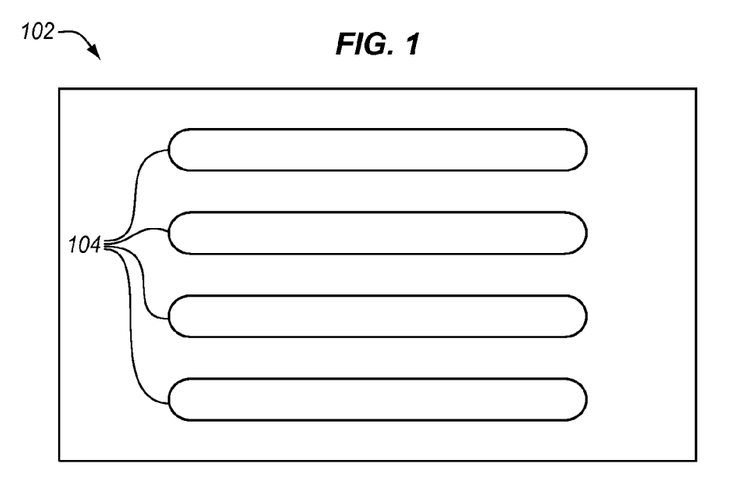
FIG. 1 is a top view of a bottom coil structure of a helical coil.
Figure 2:
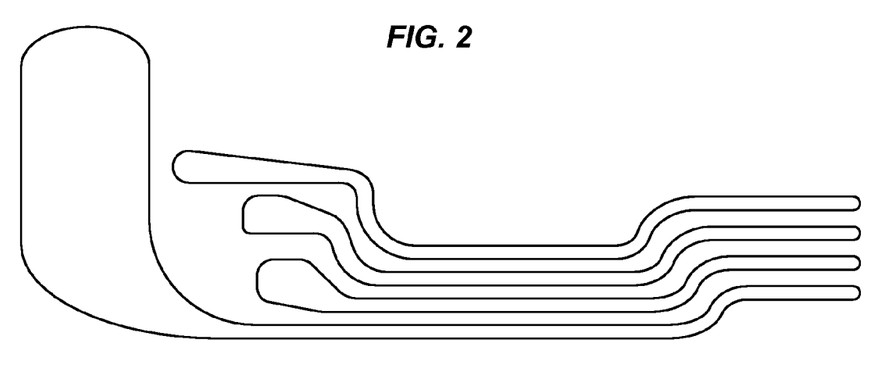
FIG. 2 is a top view of an actual coil structure of a helical coil.
Figure 3:
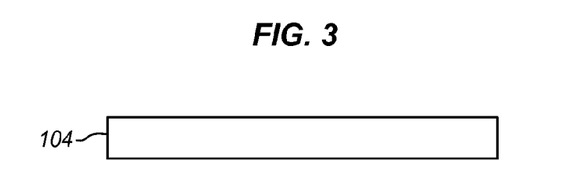
FIG. 3 is a cross-sectional view of a bottom coil structure of a helical coil.

FIGS. 1-7 illustrate an example of a fabricating a helical coil of a write element in a magnetic recording head. To begin, a bottom coil structure is formed from a conductive material (e.g., Cu or Au). FIG. 1 is a top view of bottom coil structure 102. Bottom coil structure 102 is comprised of a plurality of traces 104 that are aligned longitudinally on a plane (which is the surface of the page in FIG. 1). Although traces 104 are parallel to one another in FIG. 1, those skilled in the art will appreciate that traces 104 may have curved shapes, such as shown in FIG. 2. FIG. 2 is a top view of an actual coil structure of a helical coil, in terms of shape and spacing. The traces in FIG. 2 are not straight and parallel to one another, but are still aligned longitudinally. FIG. 3 is a cross-sectional view of bottom coil structure 102.

Figure 4:
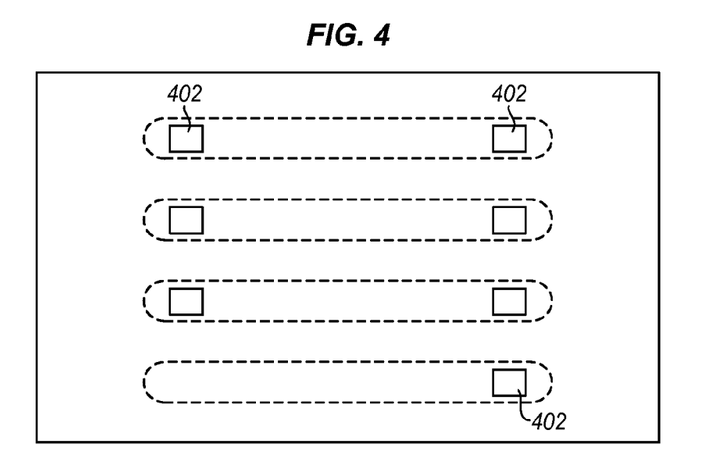
FIG. 4 is a top view of connecting structures formed on the bottom coil structure of a helical coil.

After bottom coil structure 102 is formed, multiple other steps are performed to fabricate other parts of the write element, such as the yoke of the write element. In these fabrication steps, connecting structures are built up from bottom coil structure 102 with conductive material. FIG. 4 is a top view of connecting structures 402 formed on bottom coil structure 102. Those skilled in the art will appreciate that other layers of material, such as insulation material, will be deposited on bottom coil structure 102, so bottom coil structure 102 is illustrated as dotted lines in FIG. 4.

Figure 5:
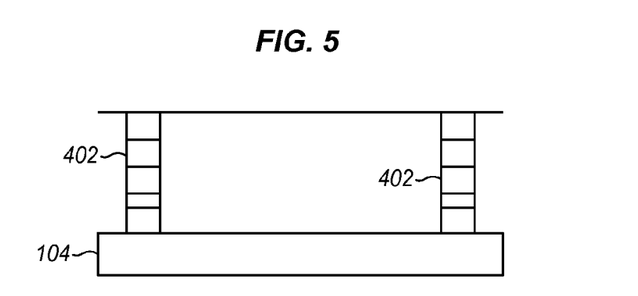
FIG. 5 is a cross-sectional view of the connecting structures formed on the bottom coil structure of a helical coil.

FIG. 5 is a cross-sectional view of connecting structures 402 formed on bottom coil structure 102. Connecting structures 402 are illustrated as being formed from multiple layers of material. As multiple other layers are formed after bottom coil structure 102, connecting structures 402 are built up. For instance, if a layer of material is deposited for a yoke, then connecting structures 402 are built up with that material. If a layer of Cu is deposited, then connecting structures 402 are built up with that material.

Figure 6:
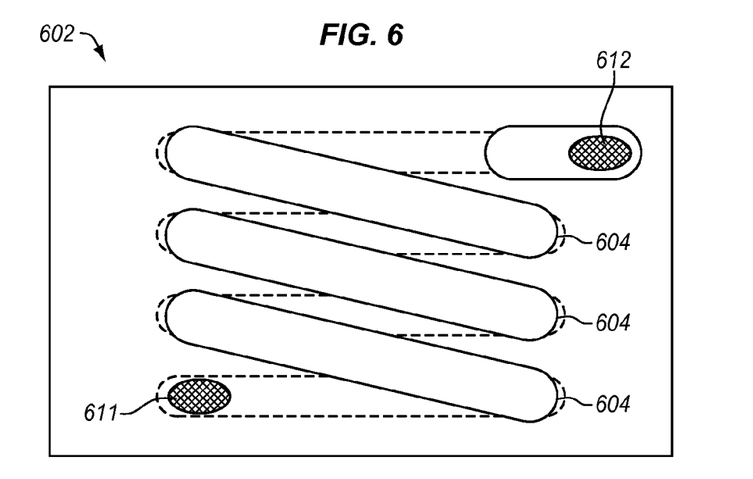
FIG. 6 is a top view of a top coil structure of a helical coil.
Figure 7:
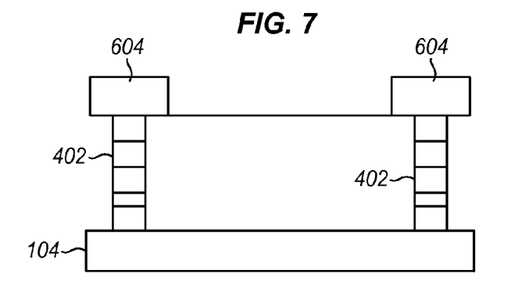
FIG. 7 is a cross-sectional view of the top coil structure of a helical coil.

A top coil structure is then formed from a conductive material (e.g., Cu or Au). FIG. 6 is a top view of top coil structure 602. Top coil structure 602 is comprised of a plurality of traces 604 that connect one of the traces 104 of bottom coil structure 102 to the next neighboring or sequential trace 104 of bottom coil structure 102 to form a helical coil. More particularly, a trace 604 of top coil structure 602 connects a right side of a trace 104 of bottom coil structure 102 to the left side of the next neighboring trace 104 of bottom coil structure 102 (as shown in FIG. 6) to define the turns of the helical coil. There are three turns illustrated in FIG. 6. Although shown in two-dimensions in FIG. 6, the helical coil has a depth coming out of the page so that the helical coil wraps around part of the write element, such as the yoke (not shown). As with bottom coil structure 102, traces 604 of top coil structure 602 may not be straight as illustrated in FIG. 6, but may have curved shapes as desired. FIG. 7 is a cross-sectional view of top coil structure 602.

In FIG. 6, electrical connection terminals 611-612, also referred to as taps, are illustrated. Terminal 611 is connected to the first trace 104 of bottom coil structure 102. Terminal 612 is connected to the last trace 104 of bottom coil structure 102 through a connecting structure 402 (not visible in FIG. 6). A potential may then be applied across terminals 611-612 to inject a current through the helical coil.

As mentioned in the Background, one problem with measuring the resistance of a helical coil is that bottom coil structure 102, connecting structures 104, and top coil structure 106 each contribute to the total resistance of the helical coil. The resistance of connecting structures 402 may be of particular interest, because connecting structures 402 are formed from multiple layers and are susceptible to fabrication errors. If the resistance of the helical coil is measured and is found to be higher than desired, then recording head fabricators are not able to determine which of the structures are causing the high resistance. Thus, recording head fabricators are unable to adequately determine which of the fabrication processes to modify to fix the problem. FIGS. 8-24 and the following description provide ways of determining the resistances of the individual structures of a helical coil.

FIGS. 8-25 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 8:
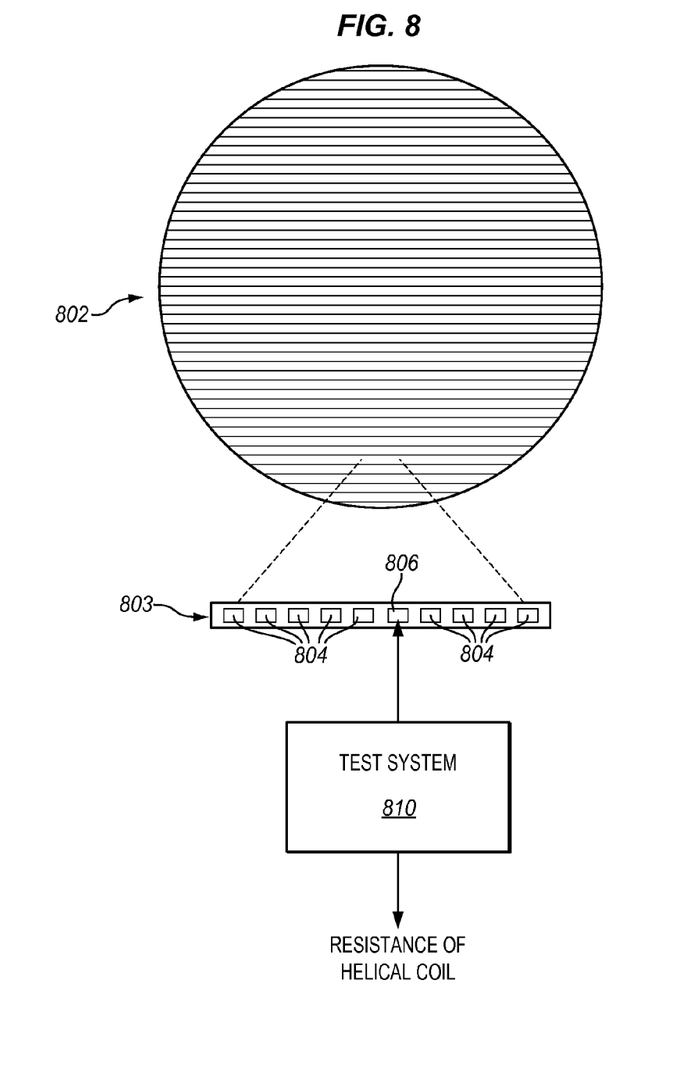
FIG. 8 illustrates a wafer in an exemplary embodiment of the invention.

FIG. 8 illustrates a wafer 802 in an exemplary embodiment of the invention. Wafer 802 comprises a plurality of rows of components, which are illustrated by the horizontal lines across wafer 802. Reference number 803 illustrates a magnified view of a portion of a row on wafer 802. This row on wafer 802 includes a plurality of magnetic recording heads 804 that include helical coils. This row also includes one or more test components 806.

A test component comprises a component fabricated on wafer 802 in order to measure/test the resistance of a helical coil. Although one test component 806 is illustrated in FIG. 8, wafer 802 may be populated with multiple test components 806. Test components 806 may be staggered throughout wafer 802 in order to provide a sampling of helical coils in different positions on wafer 802. Test component 806 is configured so that a test system 810 is able to measure resistances of test component 806. Test system 810 is also able to measure resistances of helical coils as fabricated in magnetic recording heads 804.

Figure 9:
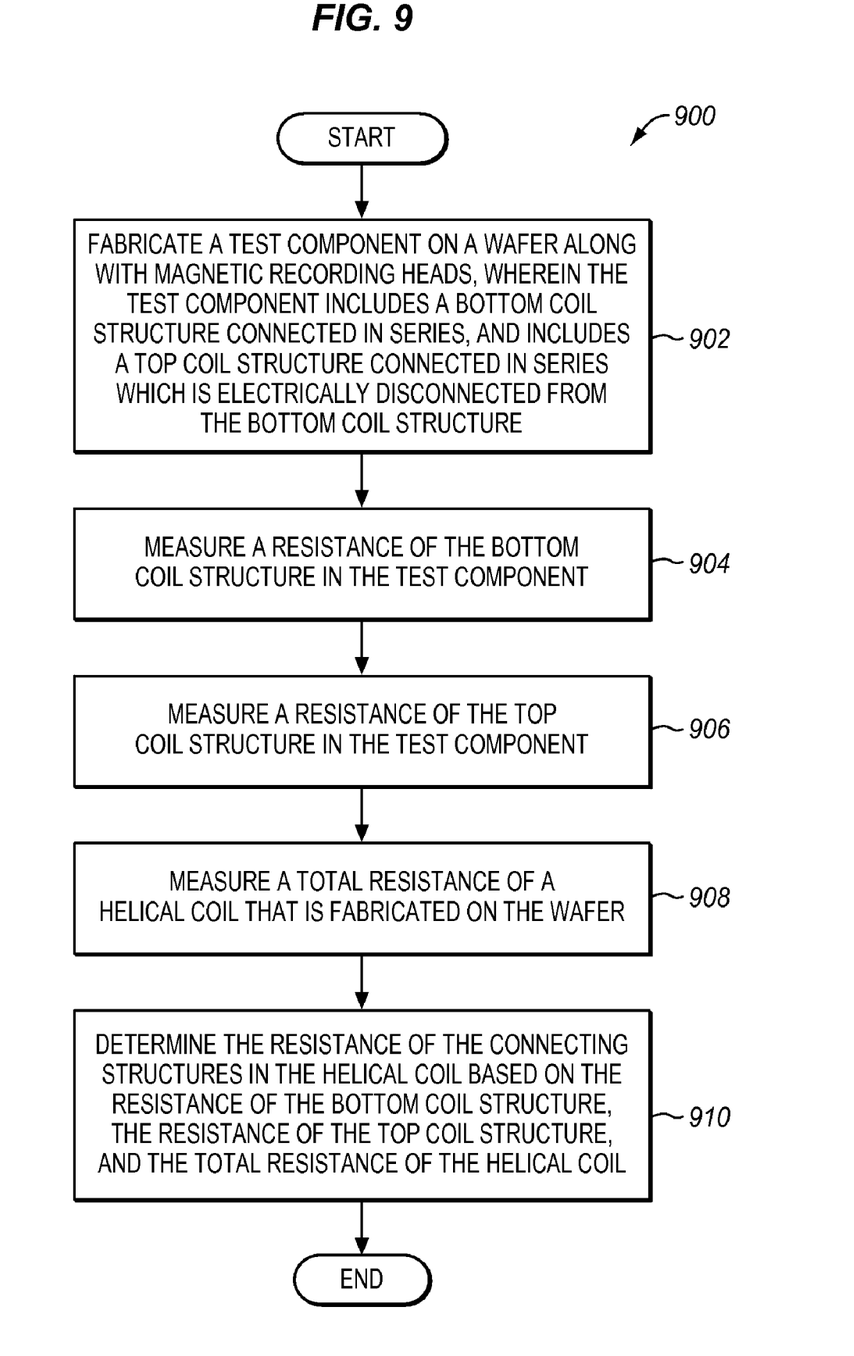
FIG. 9 is a flow chart illustrating a method of testing resistances of helical coils formed in magnetic recording heads on a wafer in an exemplary embodiment of the invention.

FIG. 9 is a flow chart illustrating a method 900 of testing resistances of helical coils formed in magnetic recording heads on a wafer in an exemplary embodiment of the invention. The steps of the flow chart in FIG. 9 are not all inclusive and may include other steps not shown.

Figure 10:
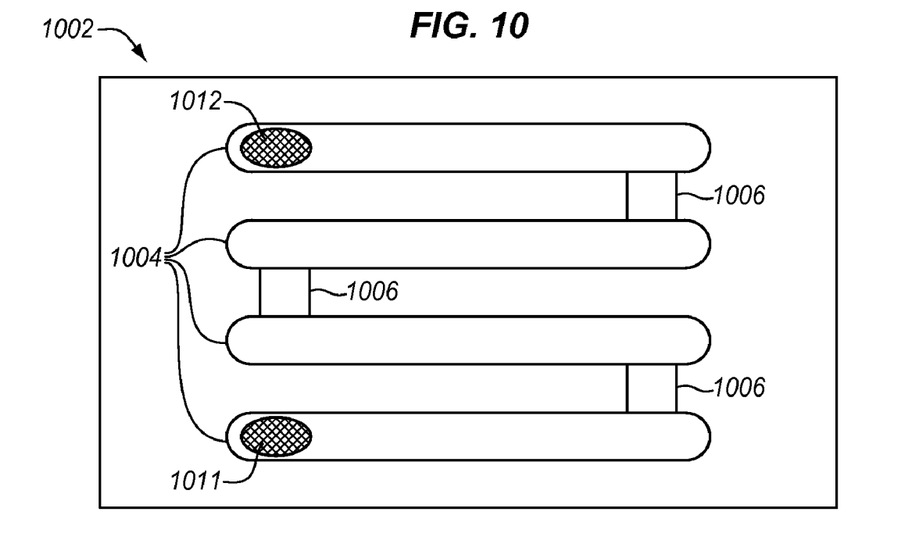
FIG. 10 is a top view of a bottom coil structure in a test component in an exemplary embodiment of the invention.
Figure 11:
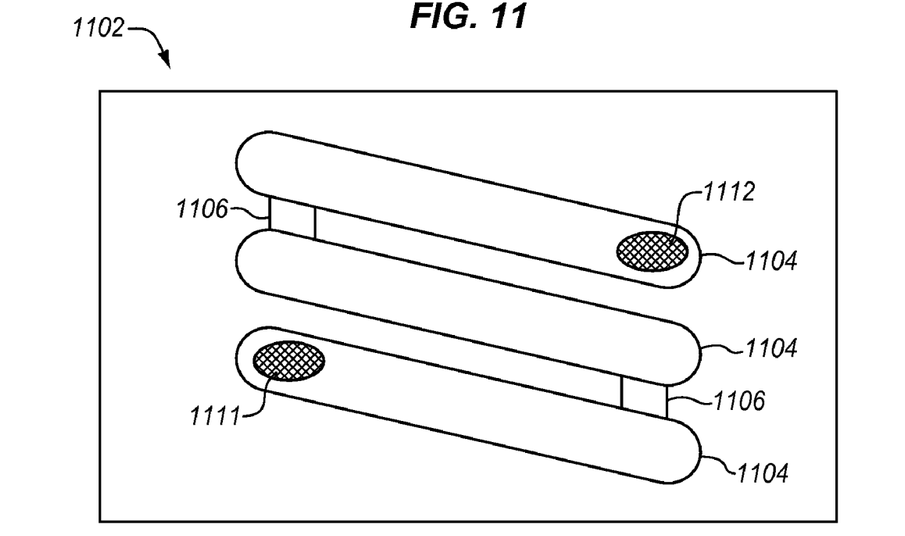
FIG. 11 is a top view of a top coil structure in a test component in an exemplary embodiment of the invention.

Step 902 comprises fabricating one or more test components 806 on a wafer 802 along with magnetic recording heads 804 (see FIG. 8). When test components 806 are fabricated on wafer 802, the test components 806 include a bottom coil structure and a top coil structure which are electrically disconnected (i.e., there are no connecting structures that electrically connect the bottom coil structure and the top coil structure). Test components 806 are also fabricated such that the bottom coil structure is connected in series, and that the top coil structure is connected in series as illustrated in FIGS. 10-11. FIG. 10 is a top view of a bottom coil structure 1002 in test component 806 in an exemplary embodiment of the invention. As was illustrated in FIG. 1, bottom coil structure 1002 includes a plurality of bottom coil traces 1004 that are aligned longitudinally on a plane. Instead of traces 1004 being electrically disconnected from one another as in FIG. 1, traces 1004 are connected to one another by connections 1006 so that bottom coil structure 1002 is connected in series. Traces 1004 of bottom coil structure 1002 are connected in series so that the combined resistance of the traces 1004 may be measured. Connections 1006 may be fabricated in the same photolithographic steps as traces 1004.

FIG. 11 is a top view of a top coil structure 1102 in test component 806 in an exemplary embodiment of the invention. As was illustrated in FIG. 6, top coil structure 1102 includes a plurality of top coil traces 1104 that are aligned to connect one of the traces 1004 of bottom coil structure 1002 to the next neighboring trace 1004 of bottom coil structure 1002 to form a helical coil. However in FIG. 11, top coil structure 1102 does not electrically connect with bottom coil structure 1002, but does have the structure as if it were. In other words, top coil structure 1102 has a similar pattern as a top coil structure used to form a helical coil, but does not electrically connect with the bottom coil structure to form a helical coil. Instead of traces 1104 being electrically disconnected from one another as in FIG. 6, traces 1104 are connected to one another by connections 1106 so that top coil structure 1102 is connected in series. Traces 1104 of top coil structure 1102 are connected in series so that the combined resistance of the traces 1104 may be measured. Connections 1106 may be fabricated in the same photolithographic steps as traces 1104.

One assumption is that the same or a similar fabrication processes used to form bottom coil structure 1002 in FIG. 10 and top coil structure 1102 in FIG. 11 in test component 806 are used to concurrently form helical coils in magnetic recording heads 804. Thus, bottom coil structures 1002 formed in test components 806 are similar to the bottom coil structures formed in magnetic recording heads 804 to form a helical coil, except that bottom coil structures 1002 in test components 806 are connected in series as described above. Similarly, top coil structures 1102 formed in test components 806 are similar to the top coil structures formed in magnetic recording heads 804 to form a helical coil, except that top coil structures 1102 in test components 806 are connected in series as described above.

Step 904 of FIG. 9 comprises measuring a resistance of bottom coil structure 1002 in test component 806. In FIG. 10, electrical connection terminals 1011-1012 are formed on two of the traces 1004. A potential may then be applied across terminals 1011-1012 to inject a current through bottom coil structure 1002, and measure a series resistance of the traces 1004 of bottom coil structure 1002. Test system 810 as shown in FIG. 8 may perform the measurement of step 904. Test system 810 may include a four-point probe and associated processing capabilities that is able to measure a resistance.

Step 906 of FIG. 9 comprises measuring a resistance of top coil structure 1102 in test component 806. In FIG. 11, electrical connection terminals 1111-1112 are formed on two of the traces 1104. A potential may then be applied across terminals 1111-1112 to inject a current through top coil structure 1102, and measure a series resistance of the traces 1104 of top coil structure 1102. Test system 810 as shown in FIG. 8 may perform the measurement of step 906.

Because bottom coil structure 1002 and top coil structure 1102 are electrically isolated from one another, the resistance of bottom coil structure 1002 and the resistance of top coil structure 1102 may be measured independently. In present testing, the total resistance of the helical coil is measured. Thus, the resistance of a bottom coil structure and the resistance of a top coil structure in a helical coil could not be measured independently.

Step 908 of FIG. 9 comprises measuring a total resistance of a helical coil that is fabricated on wafer 802. Measuring the total resistance of a helical coil may be performed in a variety of ways. As previously described, the magnetic recording heads 804 on wafer 802 (see FIG. 8) are fabricated with helical coils. Thus, the resistance of one or more of the helical coils in magnetic recording heads 804 may be measured, such as with test system 810. Alternatively, one or more test components 806 may also be fabricated with a complete helical coil, much like a complete helical coil is fabricated in magnetic recording heads 806. The resistance of one or more of the helical coils in test components 806 may be measured.

Step 910 of FIG. 9 comprises determining the resistance of the connecting structures in a helical coil based on the resistance of bottom coil structure 1002, the resistance of top coil structure 1102, and the total resistance of the helical coil. The helical coil has three main factors contributing to its total resistance, which are the bottom coil structure, the top coil structure, and the connecting structures. With the test structures 806 described above, the resistance of bottom coil structure 1002 and the resistance of top coil structure 1102 may be determined. Also, the total resistance of the helical coil may be determined. As a result, the resistance of the connecting structures of the helical coil may be determined by subtracting the resistance of bottom coil structure 1002 and the resistance of top coil structure 1102 from the total resistance of the helical coil. Recording head fabricators are thus able to identify the individual resistance of each contributing factor of a helical coil, which is the bottom coil structure, the top coil structure, and the connecting structures. If there is a higher resistance measured in the helical coil than expected, then recording head fabricators are able to locate where the problem is in an efficient manner and adjust the fabrication processes accordingly.

Figure 12:
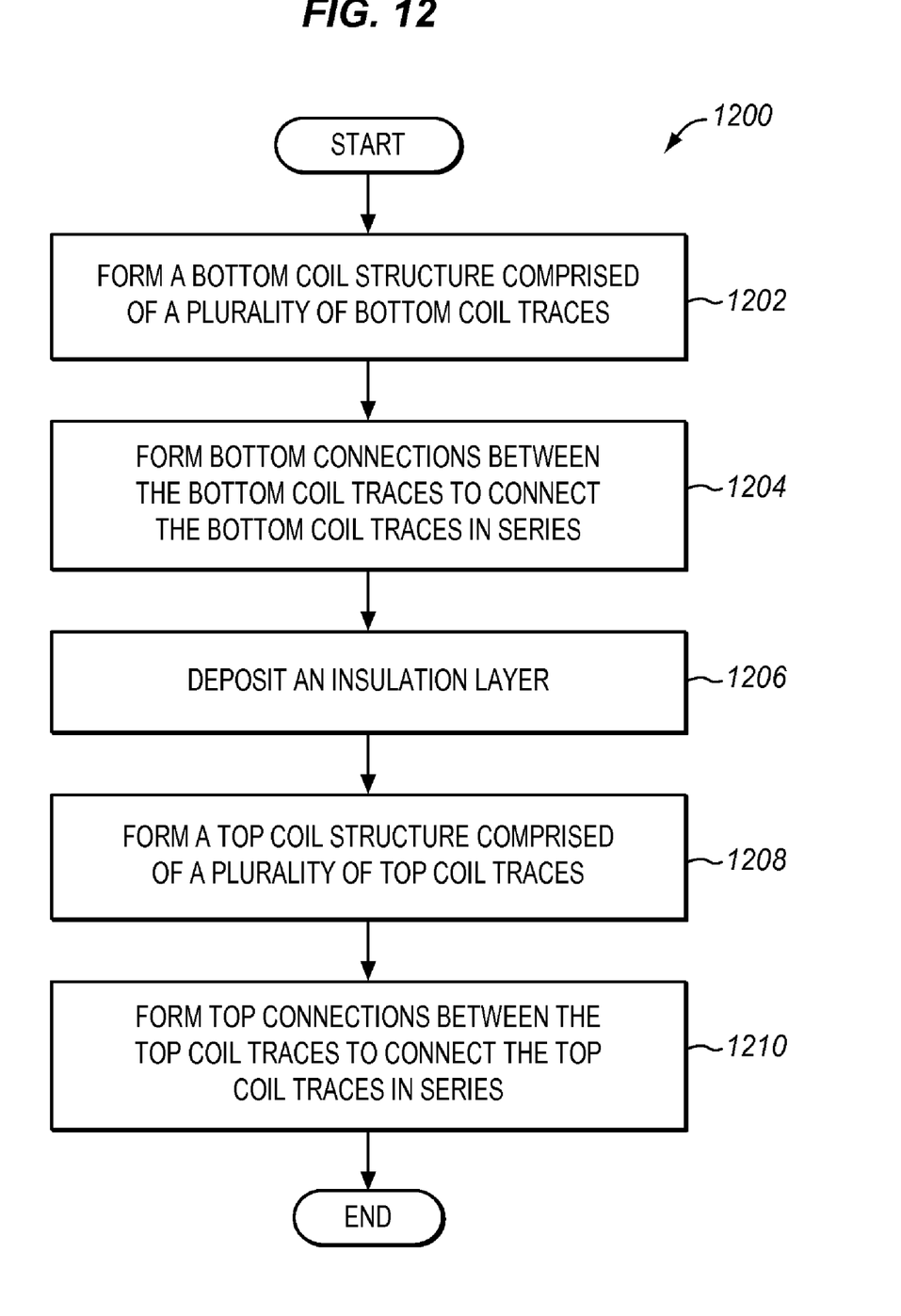
FIG. 12 is a flow chart illustrating a method of fabricating test components in an exemplary embodiment of the invention.

FIG. 12 is a flow chart illustrating a method 1200 of fabricating test components, such as test component 806, in an exemplary embodiment of the invention. FIGS. 13-17 illustrate the results of the fabrication steps of method 1200 in exemplary embodiments of the invention. The steps of the flow chart in FIG. 12 are not all inclusive and may include other steps not shown.

Figure 13:
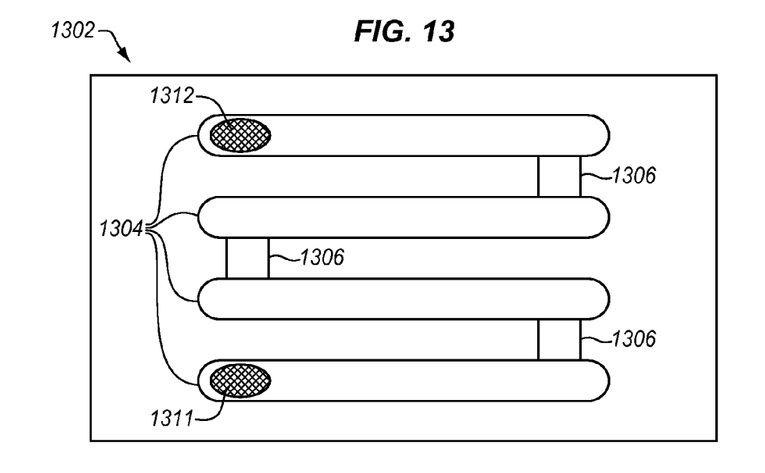
FIG. 13 is a top view of a bottom coil structure formed according to the method of FIG. 12 in an exemplary embodiment of the invention.

Step 1202 comprises forming a bottom coil structure in test component 806. FIG. 13 is a top view of bottom coil structure 1302 formed according to step 1202. Bottom coil structure 1302 is formed from any desired electrically conductive material, such as NiFe or Cu. Bottom coil structure 1302 includes a plurality of bottom coil traces 1304 that are aligned longitudinally on a plane. Traces 1304 may have different lengths, widths, sizes, shapes, and spacing in other embodiments. For example, traces 1304 may resemble the traces in FIG. 2. Bottom coil structure 1302 may include more or less traces 1304 than illustrated in FIG. 13.

Step 1204 in FIG. 12 comprises forming bottom connections 1306 between traces 1304 to connect traces 1304 of bottom coil structure 1302 in series (see also FIG. 13). Bottom connections 1306 may be fabricated in the same photolithographic steps as traces 1304. Bottom connections 1306 connect the traces 1304 of bottom coil structure 1302 in series so that the combined resistance of the traces 1304 may be measured. The locations of bottom connections 1306 may correspond with the locations of connecting structures in an actual helical coil. For instance, FIG. 4 illustrates a bottom coil structure 102 with the locations of the connecting structures 402 indicated. Connections 1306 may thus correspond with those locations. Bottom connections 1306 may connect traces 1304 in many desired ways to form a series circuit, as FIG. 13 illustrates just one example. FIG. 13 further illustrates electrical connection terminals 1311-1312 that are formed on two of the traces 1304. Terminals 1311-1312 are points where test system 810 may measure the resistance of bottom coil structure 1302.

Figure 14:
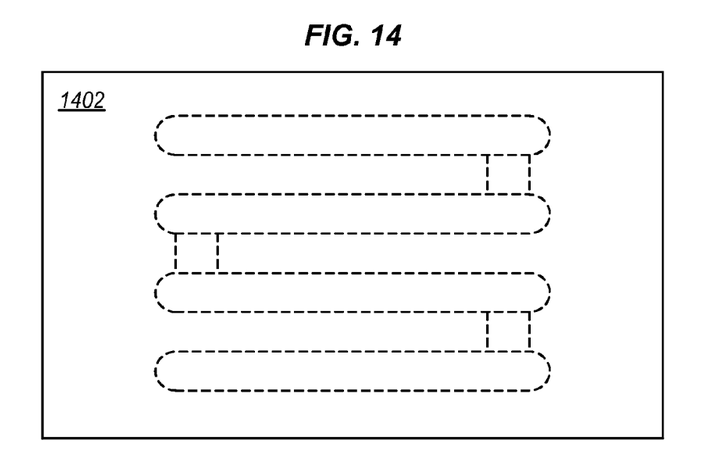
FIG. 14 is a top view of an insulation layer formed according to the method of FIG. 12 in an exemplary embodiment of the invention.
Figure 15:
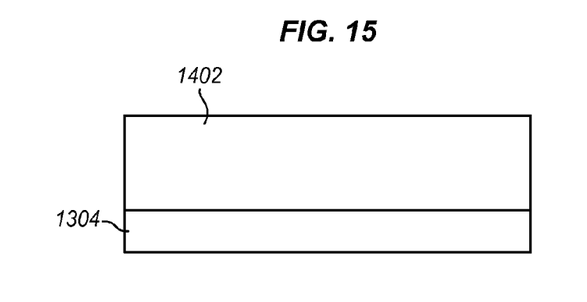
FIG. 15 is a cross-sectional view of the insulation layer formed on the bottom coil structure according to the method of FIG. 12 in an exemplary embodiment of the invention.

Step 1206 in FIG. 12 comprises depositing an insulation layer 1402 in test component 806. FIG. 14 is a top view of test component 806 with insulation layer 1402 formed according to step 1206. Insulation layer 1402 is formed from a material that is not electrically conductive, such as alumina, which acts as insulation between bottom coil structure 1302 and a subsequently deposited top coil structure. Insulation layer 1402 is deposited full-film so that it covers bottom coil structure 1302. Bottom coil structure 1302 is illustrated as dotted lines in FIG. 14 to illustrate its location underneath insulation layer 1402. FIG. 15 is a cross-sectional view of insulation layer 1402 formed on bottom coil structure 1302.

Figure 16:
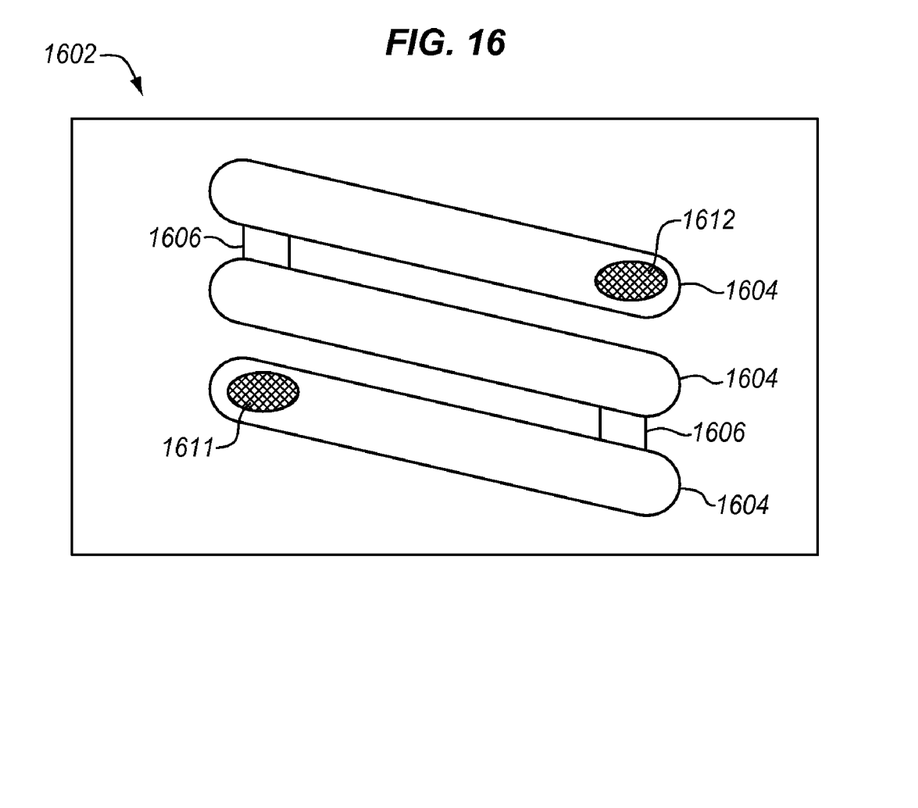
FIG. 16 is a top view of a top coil structure formed according to the method of FIG. 12 in an exemplary embodiment of the invention.
Figure 17:
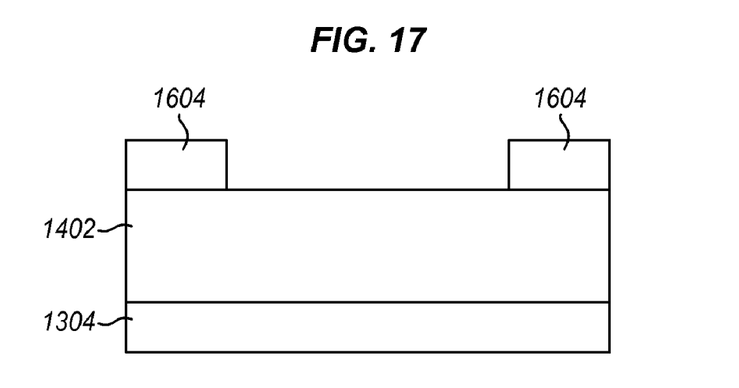
FIG. 17 is a cross-sectional view of the top coil structure formed on the insulation layer according to the method of FIG. 12 in an exemplary embodiment of the invention.

Step 1208 in FIG. 12 comprises forming a top coil structure in test component 806. FIG. 16 is a top view of top coil structure 1602 formed according to step 1208. Top coil structure 1602 is formed from any desired electrically conductive material, such as NiFe or Cu. Top coil structure 1602 includes a plurality of top coil traces 1604 that are aligned to connect one of the traces 1304 of bottom coil structure 1302 to the next neighboring trace 1304 of bottom coil structure 1302 to form a helical coil (see also FIG. 13). However in FIG. 16, top coil structure 1602 does not electrically connect to bottom coil structure 1302, but does have the structure as if it were. FIG. 17 is a cross-sectional view of top coil structure 1602 formed on insulation layer 1402.

Step 1210 of FIG. 12 comprises forming top connections 1606 between traces 1604 to connect traces 1604 in series (see also FIG. 16). Top connections 1606 may be fabricated in the same photolithographic steps as traces 1604. Top connections 1606 connect the traces 1604 of top coil structure 1602 in series so that the combined resistance of the traces 1604 may be measured. The locations of top connections 1606 may again correspond with the locations of connecting structures in an actual helical coil. Top connections 1606 may connect traces 1604 in many desired ways to form a series circuit, as FIG. 16 illustrates just one example. FIG. 16 further illustrates electrical connection terminals 1611-1612 that are formed on two of the traces 1604. Terminals 1611-1612 are points where test system 810 may measure the resistance of top coil structure 1602.

Connecting the bottom coil structure 1302 in series allows test system 810 to measure the series resistance of bottom coil structure 1302 defined in test component 806. Any significant resistance found in bottom coil structure 1302 indicates a problem with the fabrication processes for the bottom coil structures of a helical coil. Similarly, connecting the top coil structure 1602 in series allows test system 810 to measure the series resistance of top coil structure 1602 defined in test component 806. Any significant resistance found in top coil structure 1602 indicates a problem with the fabrication processes for the top coil structures of a helical coil. The resistance measured in bottom coil structure 1302 and the resistance measured in top coil structure 1602 may also be used, along with the total resistance for an actual helical coil, to determine the resistance of connecting structures of a helical coil, as described above. Recording head fabricators are thus able to modify fabrication processes accordingly if problems are encountered.

Those skilled in the art will appreciate that bottom coil structure 1302 and top coil structure 1602 do not have to be fabricated in the same test component 806. Bottom coil structure 1302 may be fabricated in one test component, while top coil structure 1602 may be fabricated in another test component.

Figure 18:
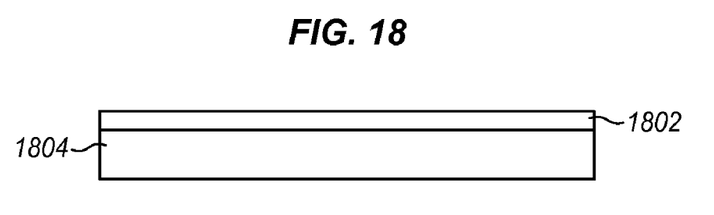
FIG. 18 is a cross-sectional view of a seed layer deposited on a substrate.
Figure 19:
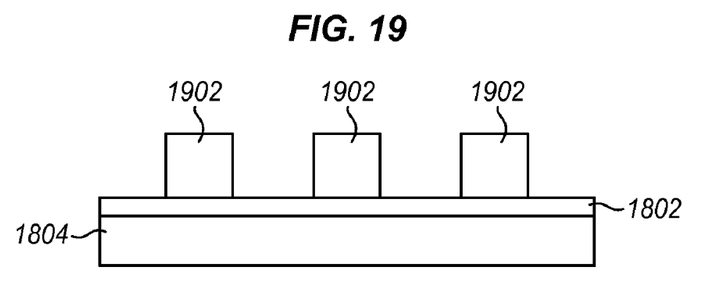
FIG. 19 is a cross-sectional view of resists formed on a seed layer.
Figure 20:
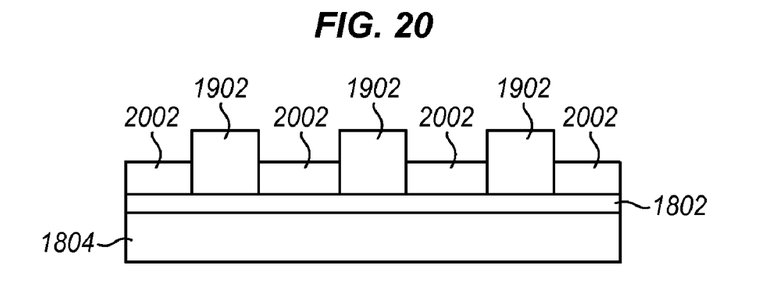
FIG. 20 is a cross-sectional view of traces of a coil structure plated on a seed layer.
Figure 21:
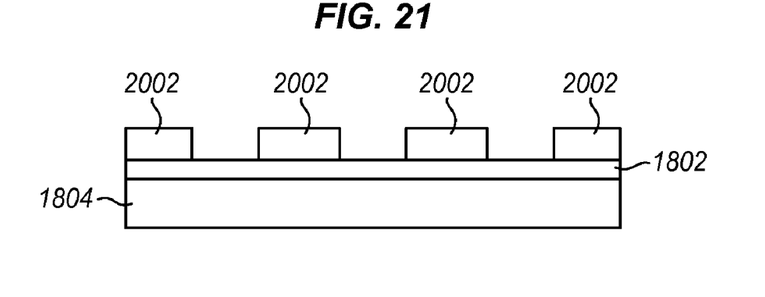
FIG. 21 is a cross-sectional view of the coil structure with resists removed.
Figure 22:
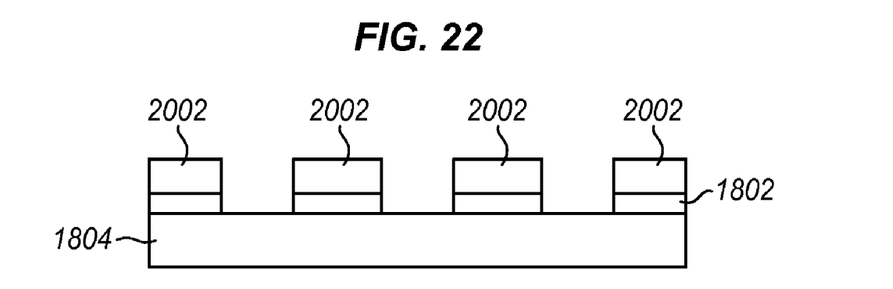
FIG. 22 is a cross-sectional view of the coil structure with the seed layer etched away between the traces.
Figure 23:
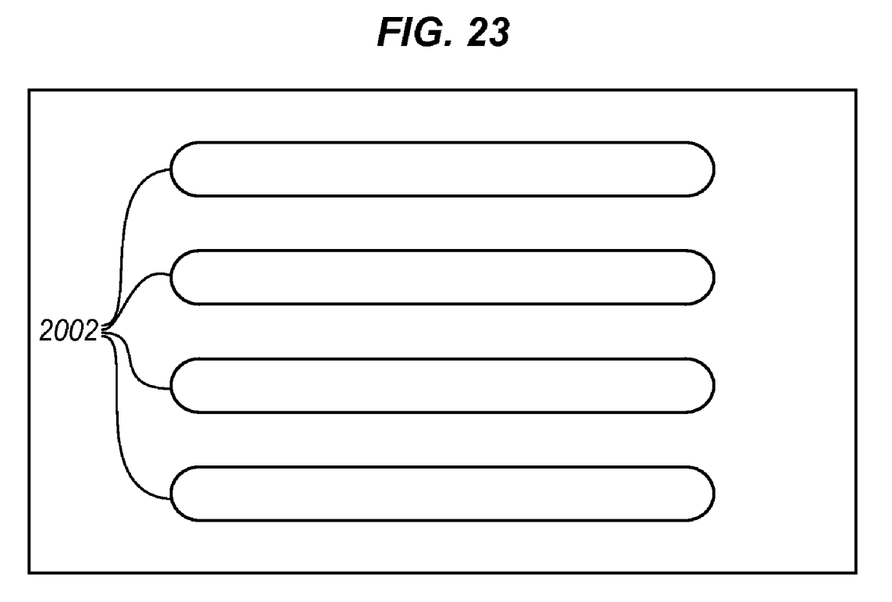
FIG. 23 is a top view of the coil structure.

In fabricating a bottom coil structure or a top coil structure in a magnetic recording head, there may be unwanted shorts between the traces. FIGS. 18-23 illustrate how a typical coil structure is fabricated. FIG. 18 is a cross-sectional view of a seed layer 1802 deposited on a substrate 1804. Seed layer 1802 is deposited so that conductive material for the coil structure may be plated on top of it. After seed layer 1802 is deposited, photolithographic processes are performed to pattern resists on seed layer 1802. FIG. 19 is a cross-sectional view of resists 1902 formed on seed layer 1802. Resists 1902 are patterned so that the regions of seed layer 1802 that are exposed correspond with the locations of the coil structure. Conductive material is then plated on top of the exposed regions of seed layer 1802 forming traces of the coil structure (either bottom or top). FIG. 20 is a cross-sectional view of the traces 2002 of a coil structure plated on seed layer 1802. After traces 2002 are formed, resists 1902 are removed. FIG. 21 is a cross-sectional view of the coil structure with resists 1902 removed. With the resists removed, the remaining seed layer 1802 is removed between traces 2002 of the coil structure with an etching process. FIG. 22 is a cross-sectional view of the coil structure with seed layer 1802 etched away between traces 2002. The etching process ideally removes all of seed layer 1802 between traces 2002, as is shown in FIG. 22. FIG. 23 is a top view of the coil structure. As with the bottom coil structure and the top coil structures described above, the traces 2002 of the coil structure are aligned longitudinally on a plane.

One problem encountered in fabricating a coil structure, such as in FIG. 23, is that some of the seed layer 1802 may not be etched away between traces 2002. Seed layer 1802 is formed from an electrically conductive material, so if some seed layer 1802 remains between any of traces 2002, then the traces 2002 get shorted. It would be desirable to test for these types of shorts, as is illustrated in FIGS. 24-25.

Figure 24:
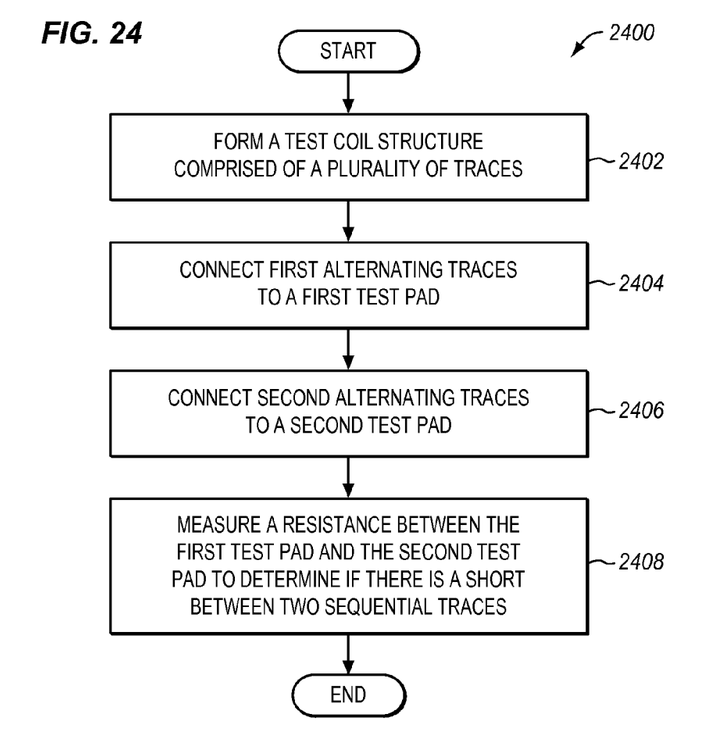
FIG. 24 is a flow chart illustrating a method of fabricating a test component adapted to test for shorts in a coil structure in an exemplary embodiment of the invention.
Figure 25:
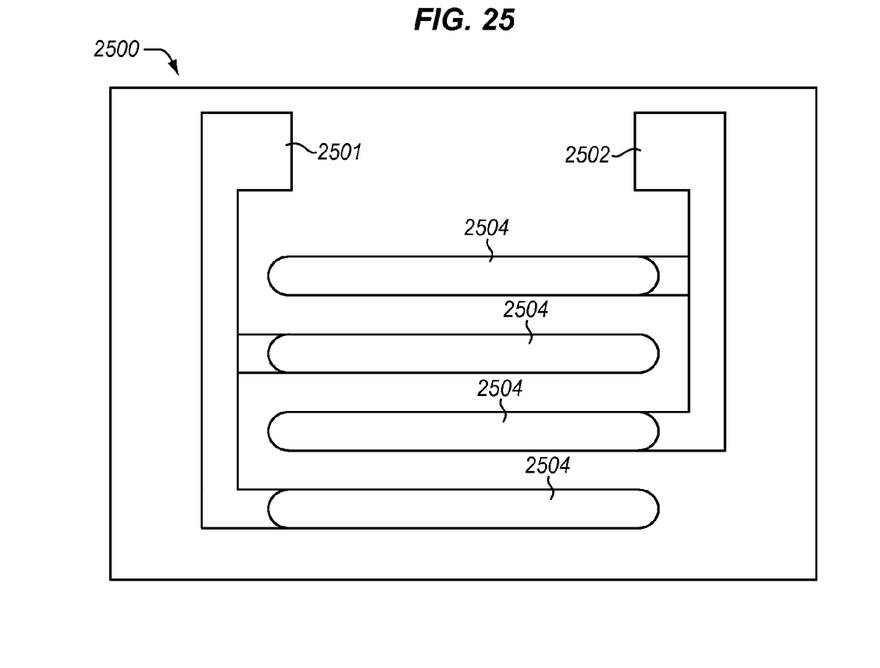
FIG. 25 is a top view of a test coil structure in an exemplary embodiment of the invention.

FIG. 24 is a flow chart illustrating a method 2400 of fabricating a test component adapted to test for shorts in a coil structure in an exemplary embodiment of the invention. The steps of the flow chart in FIG. 24 are not all inclusive and may include other steps not shown. As with other test components described in FIG. 8, the test component formed according to method 2400 may be fabricated on a wafer along with magnetic recording heads 804.

Step 2402 comprises forming a test coil structure comprised of a plurality of traces. FIG. 25 is a top view of test coil structure 2500. Test coil structure 2500 is formed from any desired electrically conductive material, such as Cu or Au. Test coil structure 2500 includes a plurality of traces 2504 that are aligned longitudinally on a plane. Traces 2504 may have different lengths, widths, sizes, shapes, and spacing in other embodiments.

Step 2404 comprises forming a first test pad 2501 and connecting first alternating traces 2504 to the first test pad 2501. Test pad 2501 is formed from any desired electrically conductive material, and may be formed in the same lithographic step as traces 2504. Test pad 2501 is connected to the bottom trace 2504 in FIG. 25, and is connected to the trace 2504 third from the bottom.

Step 2406 comprises forming a second test pad 2502 and connecting second alternating traces 2504 to the second test pad 2502. Test pad 2502 is formed from any desired electrically conductive material, and may be formed in the same lithographic step as traces 2504. Test pad 2502 is connected to the trace 2504 second from the bottom in FIG. 25, and is connected to the top trace 2504.

Step 2408 comprises measuring a resistance between test pad 2501 and test pad 2502 to determine if there is a short between two sequential traces 2504. Test system 810 (see FIG. 8) may be used to measure the resistance. If any seed layer 1802 remains between two sequential traces 2504 in coil structure 2500, there will be a short between these traces. The resistance measured between the test pads 2501-2502 will not be very high, like that of an open circuit. Normally, the resistance between the test pads 2501-2502 would be an open circuit if the coil structure were fabricated properly. Thus, test coil structure 2500 allows recording head fabricators to identify problems in fabrication processes that are causing shorts in coil structures.

Although specific embodiments were described herein, the scope of the invention is not limited to those specific embodiments. The scope of the invention is defined by the following claims and any equivalents thereof.

We claim:

1. A method of testing resistances of helical coils formed in magnetic recording heads on a wafer, wherein the helical coils include a bottom coil structure, a top coil structure, and a plurality of connecting structures that electrically connect the bottom coil structure and the top coil structure to define a helical coil, the method comprising:

fabricating a test component on the wafer along with the magnetic recording heads, wherein the test component includes a bottom coil structure connected in series, and also includes a top coil structure connected in series which is electrically disconnected from the bottom coil structure;

measuring a resistance of the bottom coil structure in the test component;

measuring a resistance of the top coil structure in the test component;

measuring a total resistance of a helical coil that is fabricated on the wafer; and determining the resistance of the connecting structures in the helical coil based on the resistance of the bottom coil structure, the resistance of the top coil structure, and the total resistance of the helical coil.

2. The method of claim 1 wherein fabricating a test component on the wafer along with the magnetic recording heads comprises:

forming the bottom coil structure in the test component, wherein the bottom coil structure comprises a plurality of bottom coil traces;

forming bottom connections between the bottom coil traces to connect the bottom coil traces in series;

depositing an insulation layer in the test component;

forming the top coil structure in the test component on the insulation layer, wherein the top coil structure comprises a plurality of top coil traces; and forming top connections between the top coil traces to connect the top coil traces in series.

3. The method of claim 1 further comprising:

fabricating a plurality of test components that are staggered throughout the wafer.

4. The method of claim 1 wherein measuring a total resistance of a helical coil that is fabricated on the wafer comprises:

measuring the resistance of a helical coil that is fabricated in one of the magnetic recording heads on the wafer.

5. The method of claim 1 wherein measuring a total resistance of a helical coil that is fabricated on the wafer comprises:

measuring the resistance of a helical coil that is fabricated in another test component.

6. The method of claim 1 further comprising:

forming a coil structure in another test component, wherein the coil structure includes a plurality of traces that are substantially aligned longitudinally on a plane;

connecting first alternating traces to a first test pad;

connecting second alternating traces to a second test pad; and measuring a resistance between the first test pad and the second test pad to determine if there is a short between two sequential traces.

7. The method of claim 2 wherein:

the bottom connections are formed in locations corresponding with locations for the connecting structures in a helical coil; and the top connections are formed in locations corresponding with the locations for the connecting structures in a helical coil.

8. A method of testing resistances of helical coils formed in magnetic recording heads on a wafer, wherein the helical coils include a bottom coil structure, a top coil structure, and a plurality of connecting structures that electrically connect the bottom coil structure and the top coil structure to define a helical coil, the method comprising:

fabricating a test component on the wafer concurrently with the magnetic recording heads that include helical coils by:

forming a bottom coil structure in the test component, wherein the bottom coil structure comprises a plurality of bottom coil traces; and forming bottom connections between the bottom coil traces to connect the bottom coil traces in series.

9. The method of claim 8 further comprising:

depositing an insulation layer in the test component;

forming a top coil structure in the test component on the insulation layer, wherein the top coil structure comprises a plurality of top coil traces; and forming top connections between the top coil traces to connect the top coil traces in series.

10. The method of claim 9 further comprising:

measuring a resistance of the bottom coil structure in the test component;

measuring a resistance of the top coil structure in the test component;

measuring a total resistance of a helical coil that is fabricated on the wafer; and determining the resistance of the connecting structures in the helical coil based on the resistance of the bottom coil structure, the resistance of the top coil structure, and the total resistance of the helical coil.

11. The method of claim 9 wherein:

the bottom connections are formed in locations corresponding with locations for the connecting structures in a helical coil; and the top connections are formed in locations corresponding with the locations for the connecting structures in a helical coil.

* * * * *